United States Patent
Kohama

Patent Number: 5,812,939
Date of Patent: Sep. 22, 1998

[54] SWITCH SEMICONDUCTOR INTEGRATED CIRCUIT AND COMMUNICATION TERMINAL DEVICE

[75] Inventor: Kazumasa Kohama, Kanagawa, Japan

[73] Assignee: Sony Corporation, Japan

[21] Appl. No.: 686,864

[22] Filed: Aug. 1, 1996

[30] Foreign Application Priority Data

Aug. 10, 1995 [JP] Japan ................................ 7-227038

[51] Int. Cl.$^6$ ................ H04B 1/44; H03F 1/36
[52] U.S. Cl. ................ 455/78; 455/82; 455/83; 327/408; 327/427; 333/103
[58] Field of Search ................ 455/73, 78, 80, 455/82, 83; 333/101, 103, 104, 262; 327/408, 416, 423, 424, 427, 430, 434, 436; 307/111, 112, 115, 116; 370/278, 282

Primary Examiner—Reinhard J. Eisenzopf
Assistant Examiner—Sam Bhattacharya
Attorney, Agent, or Firm—Ronald P. Kananen

[57] ABSTRACT

In a switch semiconductor integrated circuit, a switch for high frequency signal is constituted by four field-effect transistor stages connected in series to the first to fourth signal paths arranged in a ring shape and two field-effect transistor stages connected which are in a shunt position with respect to the signal paths such that two signal paths are positioned between two field-effect stages which are opposite to each other. At this time, the same voltage is impressed to the signal paths which are in a position opposite to each other among four signal paths, and the control voltage which are complementary to each other is impressed to the adjacent signal paths. Therefore, the number of field-effect transistor stages connected in a shunt position with respect to the signal paths and the number of control lines necessary to control the switching control can be reduced comparing to a conventional one; thus a small-sized switch semiconductor integrated circuit can be realized comparing to a conventional switch.

8 Claims, 6 Drawing Sheets

| ON-PORT | CTL1 | $\overline{CTL1}$ | CTL2 | $\overline{CTL2}$ |
|---------|------|------|------|------|
| RF1-RF2 | HIGH | LOW | LOW | HIGH |
| RF2-RF3 | LOW | HIGH | HIGH | LOW |
| RF3-RF4 | HIGH | LOW | HIGH | LOW |
| RF4-RF1 | LOW | HIGH | LOW | HIGH | ns text content.

SWITCH SEMICONDUCTOR INTEGRATED CIRCUIT AND COMMUNICATION TERMINAL DEVICE

BACKGROUND OF THE INVENTION

1. Field of the Invention

This invention relates to a switch semiconductor integrated circuit and communication terminal equipment, and more particularly to an improvement of a 2-input 2-output switch circuit which requires a low insertion loss and high isolation and communication terminal equipment using the switch circuit.

2. Description of the Related Art

Nowadays, mobile communication business has been remarkably developed for use in an automobile telephone and a portable telephone, etc. and a shortage of communication circuit is becoming more serious. Moreover, various kinds of mobile communication systems are being used in all the countries of the world. Most of these mobile communication systems use the digital communication system instead of the conventional analog communication system. Also, pseudo-microwave band which is higher frequency band than that of the existing system is used as communication band.

On the other hand, in the mobile communication system using the pseudo-microwave as communication band, a semiconductor field-effect transistor (FET) is mostly used in the signal processing unit of a portable terminal. Especially, in the portable terminal which regards the portability as important, a monolithic microwave IC (hereinafter, referred to as MMIC) using GaAs·FET is being actively developed as a semiconductor integrated circuit device which can realize the miniaturization, low voltage driving, and low power consumption, at the same time. Particularly, a high frequency switch for changing high frequency signal inside a portable terminal is one of the devices that need to speed up the development in the microwave signal processing devices.

To use the FET as a switching device, it is necessary to control a bias voltage to be impressed to the gate terminal. For example, gate bias whose voltage is sufficiently higher than the pinch off voltage is impressed to the gate terminal to lower the impedance between drain and source, thereby controlling the FET to be in the on state. On the contrary, gate bias whose voltage is sufficiently lower than the pinch off voltage is impressed to the gate terminal to heighten the impedance between drain and source, thereby controlling the FET to be in the off state.

When the currently used GaAs·FET is used as a switch FET, by the equivalent circuit, between drain and source approximates to the resistance component Ron in the on-state, and between drain and source approximates to the capacitance component Coff in the off-state. In addition, the resistance value and capacitance value of FET are several [Ωmm] and several hundred [fF/mm] for each gate width Wg of FET, respectively. For example, on-resistance Ron=2 [Ω mm] and capacitance component Coff=300 [fF/mm].

When the FET whose gate width Wg having the above-mentioned characteristics is about 1 [mm] is used to constitute the FET switch, the loss in the on-state for the signal band of 2 [GHz] is about 0.2 [dB] and the isolation between drain and source in the off-state is less than 10 [dB]. When the FET is individually used from these values, it can be found that the insertion loss can be small, but the isolation can not be so high.

Therefore, in the frequency being pseudo-microwave band or more, a method in which high isolation is compatible with a low insertion loss is applied by structuring a switch circuit in that the FET is connected to a position in series and to a position in shunt with respect to the signal path, respectively.

As an example of the switch circuit, there is a single pole dual throw (SPDT) switch composed of the combination of one series FET and one shunt FET with respect to the signal path. In addition, the switch circuit of this construction can realize 0.55 [dB] to 0.94 [dB] as the loss insertion characteristics at 1.9 [GHz], and can realize 23 to 31 [dB] as the isolation characteristics.

High isolation can be obtained in this way because RF signal leaked from the series FET in the off-state via the capacitance component Coff can be led to a GND by the shunt FET in the on-state.

If it is tried to realize the high isolation with only the series FET, the gate width of FET is needed to be small. However, if the gate width of FET is made small, the on-resistance Ron of FET increases so that the degradation of insertion loss can not be avoided oppositely. It is difficult to be compatible with each other. Moreover, although the switch circuit may be composed of only shunt FET, there arises a problem that the isolation at low frequency band is not sufficient if the switch circuit is composed of only shunt FET.

The SPDT switch circuit in which the low insertion loss can be compatible with the high isolation is practically used at present. The portable terminal is used not only during walking but also in an automobile, etc. When the portable terminal is used in a vehicle moving with high speed, since the sufficient sensitivity can not be obtained only by an antenna built in the portable terminal, the external antenna provided outside the vehicle is mostly used at the same time.

In this case, in a digital portable terminal using the time division multiple access (TDMA) communication system, the dual pole dual throw (DPDT) switch is often used for switching between the built-in antenna and the external antenna and between the transmitting part and the receiving part which are built in the portable terminal.

FIG. 1 shows an example of the configuration of the RF signal processing block in the portable terminal using the DPDT switch. More specifically, the DPDT switch is composed of two SPDT switches SW1 and SW2 described above. In two switches SW1 and SW2, two output terminals of the SPDT switch SW1 positioned at the antenna side are connected to first and second antennas 1 and 2, and two output terminals of the SPDT switch SW2 positioned at the RF signal processing circuit side are connected to the transmitting part 3 and the receiving part 4, respectively.

However, if two SPDT switches are used to constitute the DPDT switch, the insertion loss becomes twice comparing to the case where the SPDT switch is used individually, as a result, the output loss of the power amplifier for outputting RF signal may be large due to the insertion loss. Therefore, it has been necessary to output further to compensate the output loss. It is important to hold down the power consumption in the inner device of the portable terminal equipment to withstand long time use, and generally a power amplifier makes up the most of power consumption in the portable terminal equipment.

Therefore, it is very important to lower the insertion loss of SPDT switch described above. For instance, if the loss of 1.5 [dB] can be held down to 0.5 [dB], it can save the output of power amplifier for about 20 [%]. In this way, the low insertion loss of the switch circuit can not be avoided to extend the time for using the portable terminal equipment.

As a switch circuit for solving the problem, a method of using DPDT switch having a ring shape has been proposed as shown in FIG. 2.

The DPDT switch having the configuration shown in FIG. 2 is used so that the number of series FET is always one, the series FET which is connected between input/output terminals RF1 and RF3 connected to the first and second antennas 1 and 2 and input/output terminals RF2 and RF4 connected to the transmitting part 3 and the receiving part 4. Therefore, the insertion loss can be lowered as shown in FIG. 3.

In addition, shunt FETs FET15 to FET18 are respectively connected to the four input/output terminals RF1 to RF4, so that the sufficient isolation characteristics can be expected.

However, in adopting this configuration, four-system control terminal is needed to only control independently the control voltage impressed on the gate of each shunt FET. Including a series FET for bias control, eight-system control terminal will be needed at its maximum.

Therefore, if considering the IC package wholly, this configuration may cause a problem of increase of the number of pins and large-sized package, and has been unsuitable to portable terminal equipment which is required to be miniaturized in its size.

SUMMARY OF THE INVENTION

In view of the foregoing, an object of this invention is to provide a switch semiconductor integrated circuit which can miniaturize and simplify the configuration and the control system comparing to the prior arts, and realize the low insertion loss characteristics and the high isolation characteristics at the same time. Also, the object of this invention is to provide communication terminal equipment using the switch semiconductor integrated circuit.

The foregoing objects and other objects of the invention have been achieved by the provision of In order to solve the above problems, this invention provides a switch semiconductor integrated circuit in which fifth and sixth field-effect transistor means which have the position relationship of shunt with respect to each signal path are connected to a first signal terminal which is the connection middle point between first and fourth signal paths, among a first to fourth signal paths positioned in a ring shape, and connected to a third signal terminal which is the connection middle point between second and third signal paths.

Further, the same voltage control is given to the field-effect transistor means connected in series to the signal paths facing each other among the first to fourth signal paths. At this time, the control voltage which are complementary each other are impressed on the adjacent signal paths.

For example, when the first signal path is controlled to on-state, first, third, and sixth field-effect transistor means are made on-state by the first control voltage and by the control voltage which is complementary for the second control voltage, and second, fourth, and fifth field-effect transistor means are made off-state by the control voltage which is complementary for the first control voltage and by the second control voltage.

Further, when the second signal path is controlled to on-state, second, fourth, and fifth field-effect transistor means are made on-state by the control voltage which is complementary for the first control voltage and by the second control voltage, and first, third, and sixth field-effect transistor means are made off-state by the first control voltage and by the control voltage which is complementary for the second control voltage.

Similarly, when the third signal path is controlled to be in the on-state, first, third, and fifth field-effect transistor means are made on-state by the first and second control voltages, and second, fourth, and sixth field-effect transistor means are made off-state by the control voltage which is complementary for the first and second control voltages.

Similarly, when the fourth signal path is controlled to be in the on-state, second, fourth, and sixth field-effect transistor means are made on-state by the control voltage which is complementary for the first and second control voltages, and first, third, and fifth field-effect transistor means are made off-state by the first and second control voltages.

The nature, principle and utility of the invention will become more apparent from the following detailed description when read in conjunction with the accompanying in which like parts are designated by like reference numerals or characters.

DETAILED DESCRIPTION OF THE EMBODIMENT

Preferred embodiment of this invention will be described with reference to the accompanying drawings:

(1) Configuration of basic circuit

In this embodiment, communication terminal equipment will be explained as equipment example using a switch circuit according to this invention. In addition, communication terminal equipment in this embodiment uses the pseudo-microwave band as a communication band and uses the TDMA system as a communication system.

Figure 4:
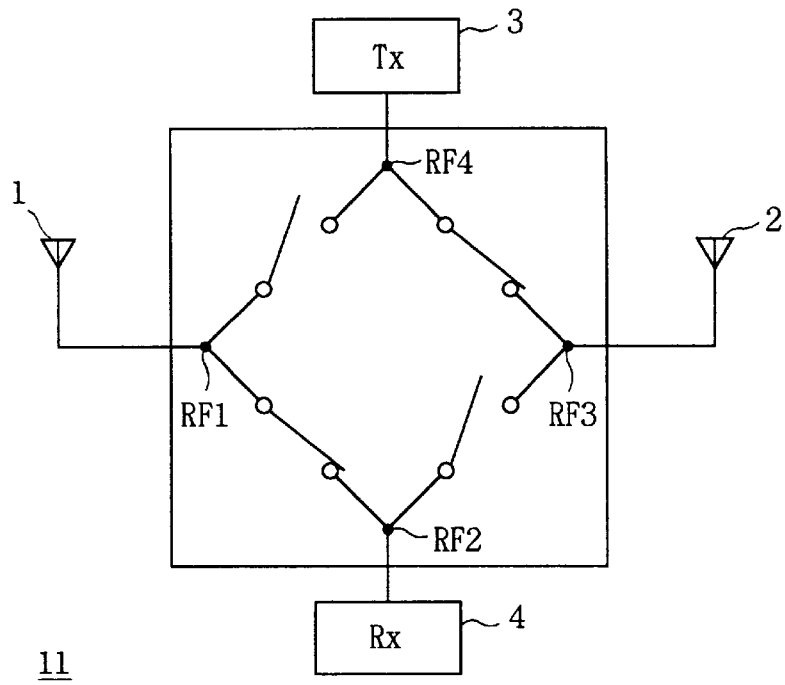
FIG. 4 is a schematic diagram explaining an example of the apparatus in which a switch semiconductor integrated circuit according to this invention is mounted.

FIG. 4 shows the RF signal processing part in communication terminal equipment for communicating by the TDMA system. Communication terminal equipment 11 has, as an antenna switch, a DPDT switch 12 in which the signal path is formed in a ring shape. The DPDT switch 12 switches the connection between two antennas 1 and 2 and a transmitting part 3 and a receiving part 4.

Here, the number of switches constituting the DPDT switch 12 is totally four: a switch on the signal path connecting between an input/output terminal RF1 to which the antenna 1 is connected and an input/output terminal RF4 to which the transmitting part 3 is connected, a switch on the signal path connecting between the input/output terminal RF1 to which the antenna 1 is connected and an input/output terminal RF2 to which the receiving part 4 is connected, a switch on the signal path connecting between an input/output terminal RF3 to which the antenna 2 is connected and the input/output terminal RF4 to which the transmitting part 3 is connected, and a switch on the signal path connecting between an input/output terminal RF3 to which the antenna 2 is connected and the input/output terminal RF2 to which the receiving part 4 is connected. Since the RF signal may pass through only one switch in any path, the insertion loss can be lowered.

Figure 5:
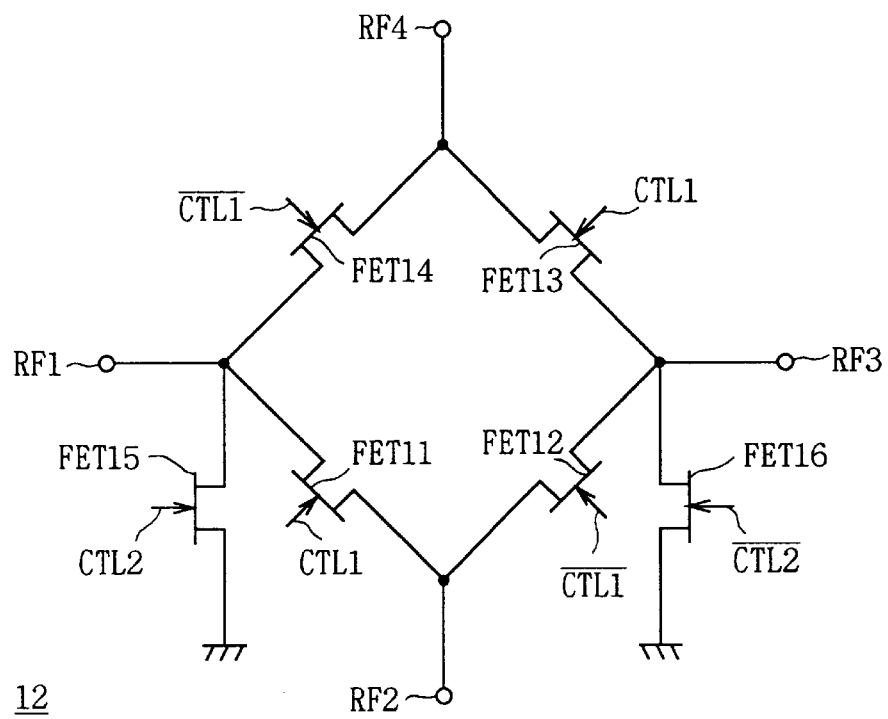
FIG. 5 is a connection diagram showing the basic constitution of a DPDT switch.

Next, FIG. 5 shows the concrete circuit constitution of the DPDT switch 12. Note that, it is assumed that any of FETs are single gate GaAs·JFETs, for instance.

The DPDT switch 12 is composed of four series FETs FET11 to FET14 connected to each of four signal paths arranged in a ring shape and two shunt FETs FET15 and FET16 arranged oppositely.

Figure 1:
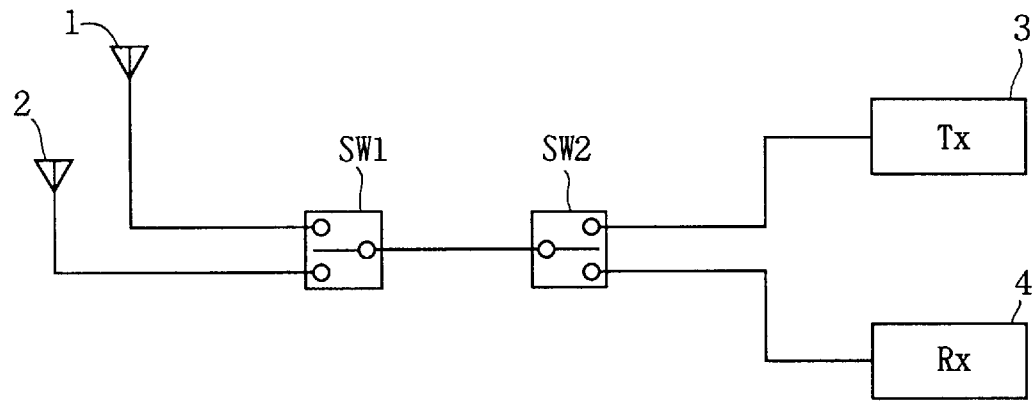
FIG. 1 is a connection diagram showing the signal processing unit of the two antenna type portable terminal using two SPDT switches.
Figure 2:
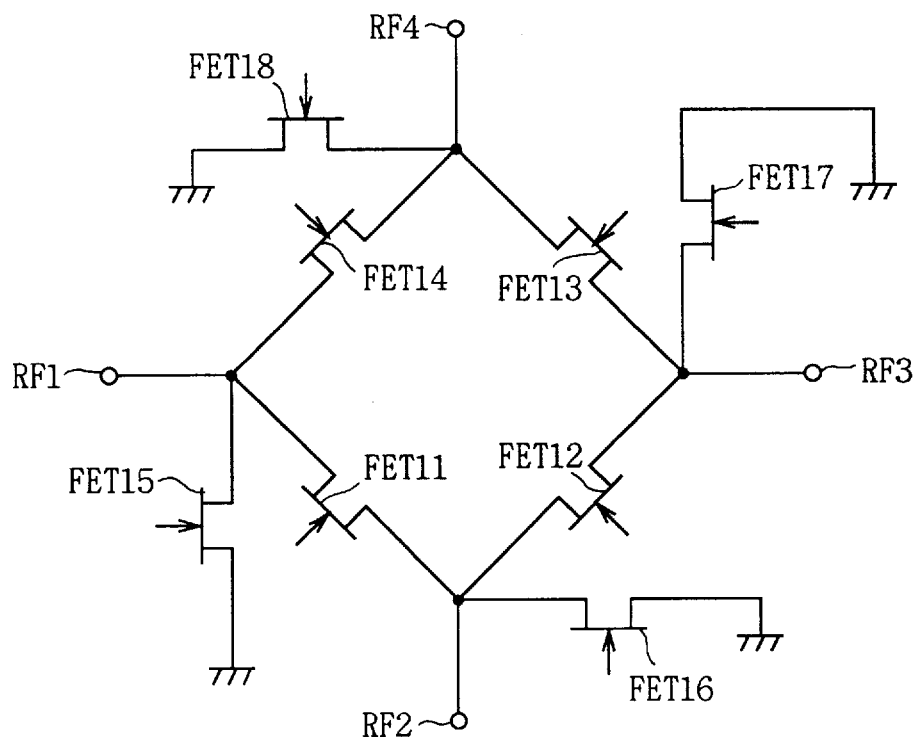
FIG. 2 is a connection diagram showing the constitution of a conventional DPDT switch using four shunt FETs.
Figure 3:
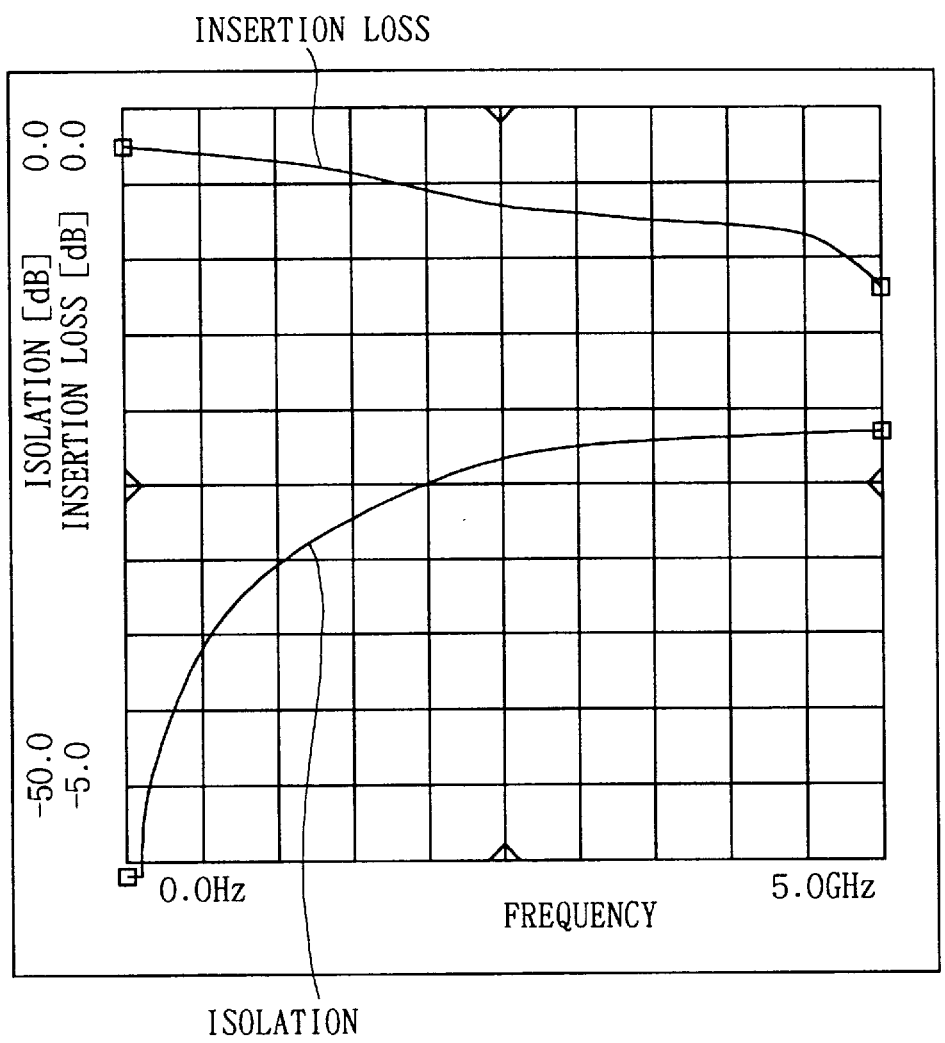
FIG. 3 is a characteristic curve diagram showing the insertion loss and isolation characteristics of the DPDT switch shown in FIG. 2.

The DPDT switch 12 has the characteristics that the number of shunt FETs is two, the half of the number of shunt FETs in the DPDT switch shown in FIG. 2, and that the series FETs and shunt FETs can be on- or off-controlled by two pairs of complementary control biases.

Thus, the DPDT switch 12 according to this invention impresses the complementary control bias voltage CTL1 and I (Inverse) CTL1 to the gate of a pair of FET11 and FET13 which are positioned oppositely among four series FETs FET11 to FET14. Further, the DPDT switch 12 impresses the complementary control bias voltage CTL2 and I (Inverse) CTL2 to the gate of two shunt FETs FET15 and FET16.

Figures 6, 8:
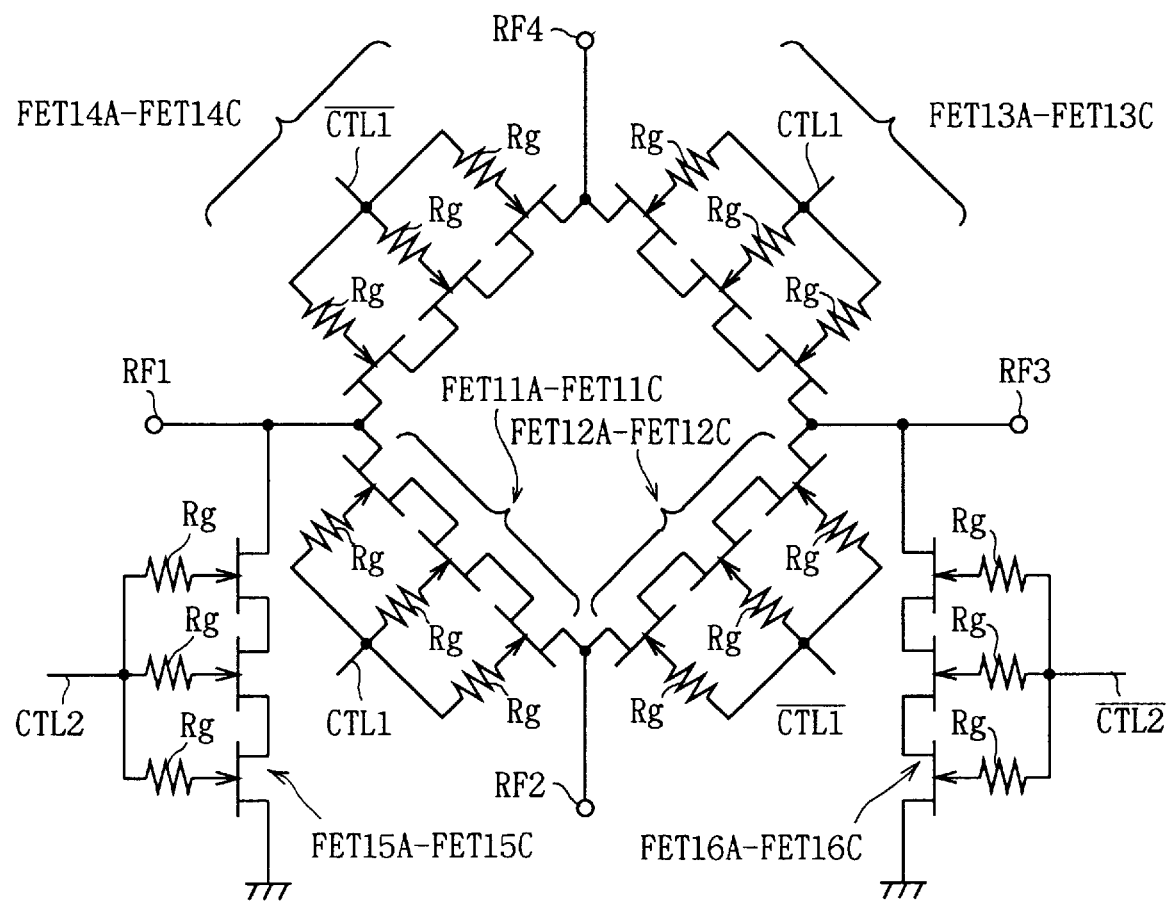
FIG. 6 is a table explaining the operation of the DPDT switch shown in FIG. 5.
FIG. 8 is a connection diagram showing an example of the circuit of the DPDT switch used in mounting.

According to the above constitution, the transmitting and receiving operation of the communication terminal equipment will be explained. In addition, the DPDT switch 12 of this embodiment switch-controls the control bias voltage CTL1 and CTL2 by utilizing that the transmitting operation and the receiving operation are not executed simultaneously in the TDMA system. FIG. 6 shows the operation state of the DPDT switch circuit based on the control bias voltage CTL1 and CTL2.

First, it will be described the case where an RF signal is received from the first antenna 1 in the on-state between input/output terminals RF1 and RF2. At this time, while the first control bias voltage CTL1 is risen to level "H", the control bias voltage I (Inverse) CTL1 which pairs with the voltage CTL1 is fallen to level "L". Also, at this time, while the second control bias voltage CTL2 is fallen to level "L", the control bias voltage I (Inverse) CTL2 which pairs with the voltage CTL2 is risen to level "H".

At this time, the series FET FET11 is on, and the series FET FET12, the series FET FET14, and the series FET FET15 are off. The signal path between RF1 and RF2 connecting the antenna 1 and the receiving part 4 becomes low insertion loss. Thereby, the communication terminal equipment 11 supplies the RF signal received at the antenna 1 to the receiving part 4 through the signal path between RF1 and RF2 whose insertion loss is lowered.

The RF signal received at a second antenna 2 is led-in to a ground via the shunt FET FET16 not to be transmitted to the receiving part 4, since the series FET FET12 inserted in the signal path between RF2 and RF3 is off state and the shunt FET FET16 is on state. In this way, the isolation of the signal path between RF2 and RF3 is sufficient.

Only the series FET FET14 in the off state is connected to the signal path between RF4 and RF1, and the shunt FET in the on state does not exist. Therefore, if this state will continue, the signal path between RF4 and RF1 can not obtain the sufficient isolation.

However, in the case of the DPDT switch 12 described above, the series FET FET13 inserted in the signal path between RF4 and RF3 is in the on state, utilizing the characteristics of the TDMA system. Therefore, it equals to the state that the shunt FET FET16 in the on-state is connected to the series FET FET14 in the offstate on the signal path between RF1 and RF4 via the series FET FET13, so as to realize the sufficient isolation.

Figure 7:
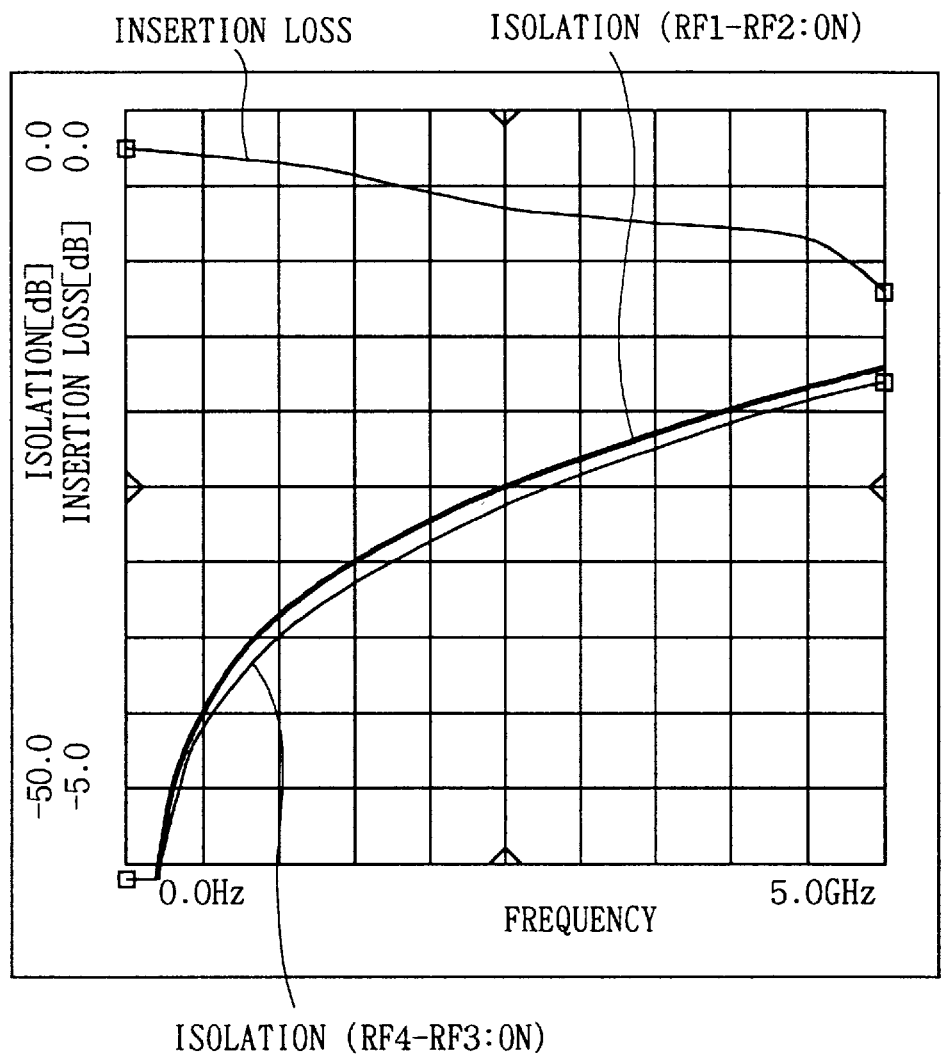
FIG. 7 is a characteristic curve diagram showing the insertion loss and isolation characteristics of the DPDT switch shown in FIG. 5.

FIG. 7 shows the insertion loss and isolation characteristics of the DPDT switch 12. As shown in FIG. 7, the DPDT switch 12 obtains the same characteristics as the conventional DPDT switch shown in FIG. 2, in spite of the number of the shunt FETs being the half of the conventional shunt FETs. In addition, FIG. 7 shows the characteristics obtained when the gate width of series FET is 0.8 [mm] and the gate width of shunt FET is 0.15 [mm].

Similarly, in the case where the wave received at the second antenna 2 is received at the receiving part 4 with the signal path between RF2 and RF3 being in the on-state, while the first control bias voltage CTL1 is fallen to level "L", the control bias voltage I (Inverse) CTL1 which pairs with the voltage CTL1 is risen to level "HH". Also, at this time, while the second control bias voltage CTL2 is risen to level "H"3, the control bias voltage I (Inverse) CTL2 which pairs with the voltage CTL2 is fallen to level "L". In this way, the radio wave received at the second antenna 2 can be received with high sensitivity.

In addition, the same operation as de scribed above is performed in transmission in the state that the signal path between RF3 and RF4 is on or in the state that the signal path between RF4 and RF1 is on.

With the above constitution, giving an attention to the TDMA communication system, the same control bias voltage is respectively impressed to two pairs of the series FETs FET1 and FET13 and the series FETs FET12 and FET14, which are facing to each other. At this time, the adjacent pair of series FETs are complementary controlled by the control bias voltage impressed to the gate of the adjacent pair of series FETs, and the shunt FETs are respectively controlled by the complementary control bias voltage. Therefore, the small-sized DPDT switch 12 realizing low insertion loss and high isolation at the same time can be realized.

Further, the DPDT switch can be switch-controlled with the minimum constitution such that four-system control line and two pairs of complementary control bias voltage, so that the DPDT switch having a small-sized IC package and few number of terminals can be realized.

(2) Examples of mounted circuit

Next, FIG. 8 shows the embodiment when the series FET connected to each of signal paths between RF1 and RF2, RF2 and RF3, RF3 and RF4, RF4 and RF1 and the shunt FET connected to the input/output terminals RF1 and RF3 are respectively constituted with three stages.

The DTDP switch shown in FIG. 8 has the same basic constitution as that of the DTDP switch shown in FIG. 5, and has the same constitution excepting the number of stages of FETs connected to each signal path. In this embodiment, the resistance Rg which is a high impedance device for bias supplying is connected to the gate of each FET.

Figure 9:
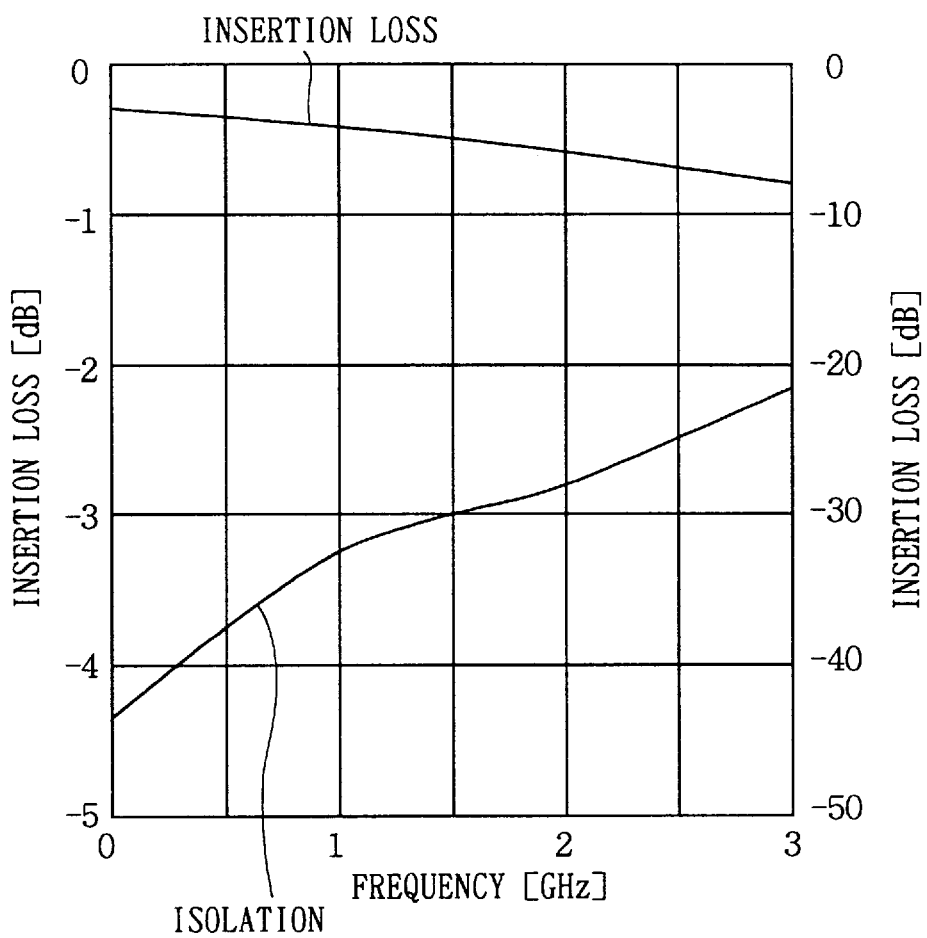
FIG. 9 is a characteristic curve diagram showing the insertion loss and isolation characteristics of the DPDT switch shown in FIG. 8.

FIG. 9 shows the insertion loss and isolation characteristics obtained in the DPDT switch 22 shown in FIG. 8. FIG.

9 uses the gate width three times the gate width of the FET described in FIG. 5, that is 2.4 [mm], in series FETs FET11A to FET11C, FET12A to FET12C, FET13A to FET13C, FET14A to FET14C, and uses the gate width five times the gate width of the FET described in FIG. 5, that is 0.8 [mm], in shunt FETs FET15A to FET15C, FET16A to FET16C.

FIG. 9 shows the measured result of the insertion loss and isolation characteristics obtained when the DPDT switch is mounted on a small plastic mold package. It is founded from FIG. 9 that, at a band of 2 [GHz], the insertion loss is low, which is under 0.6 [dB], and the isolation characteristics is high, which is over 25 [dB].

Thus, giving an attention to the TDMA communication system, the DPDT switch circuit is constituted with the minimum FET construction and control method to reduce the number of shunt FETs, so that a switch semiconductor integrated circuit, which can lower the cost and reduce the control terminals at the same time, can be realized. Therefore, a switch semiconductor integrated circuit having a small IC package can be obtained.

(3) Other embodiments

In the above embodiments, a single-gate FET is used as an FET. However, this invention is not limited to this but a multi-gate FET can be used.

Further, in the above embodiments, a junction FET is used as an FET. However, this invention is not limited to this but the FET having other constitutions, e.g., an MESFET, can be used widely.

Further, in the above embodiments, the drain or source of shunt FET is connected directly to a ground. However, this invention is not limited to this but also is applicable to the case where the capacitance to cut a current is provided between the drain or source of shunt FET and the ground. In this way, if the capacitance to cut a current is provided, the bias voltage impressed to the drain or source of shunt FET can be set to an arbitrary value.

For example, if the drain or source can be set to the preferable positive voltage, the gate electric potential with respect to source and drain can also be set to the negative electric potential relatively even when the control bias voltages CTL1 and CTL2 impressed to the gate of each FET are only positive voltage. Therefore, the DPDT switch which can perform switching-operation as a whole only by a positive power supply can be realized.

Also, in the above embodiments, a plastic package is used as an IC package. However, this invention is not only limited to this but packages made of other materials can be used.

Further, the above embodiments have dealt with the communication terminal equipment as an example of equipment in which the DPDT switch according to this invention is mounted. However, this invention is not only limited to this but is applicable widely to the case where other electronic apparatus is mounted.

According to the present invention described above, a switch for high frequency is constituted by connecting in series four field-effect transistor stages to four signal paths arranged in a ring shape, and by connecting two field-effect transistor stages which are in a shunt position with respect to the signal paths such that two signal paths are positioned between two field-effect transistor stages which are opposite to each other. The same control voltage is impressed to the signal paths in a position opposite to each other among four signal paths, and the control voltage which are complementary to each other is impressed to the adjacent signal paths. Therefore, a small-sized switch semiconductor integrated circuit can be realized, which can reduce the number of field-effect transistor stages connected in a shunt position with respect to the signal paths and the number of control lines necessary to control the switching control comparing to a conventional switch.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A switch semiconductor integrated circuit comprising:
    a first field-effect transistor stage which is connected in series to a first signal path for communicating between a first signal terminal and a second signal terminal;
    a second field-effect transistor stage which is connected in series to a second signal path for communicating between said second signal terminal and a third signal terminal;
    a third field-effect transistor stage which is connected in series to a third signal path for communicating between said third signal terminal and a fourth signal terminal;
    a fourth field-effect transistor stage which is connected in series to a fourth signal path for communicating between said fourth signal terminal and said first signal terminal;
    a fifth field-effect transistor stage which is connected between said first signal terminal and a reference electric potential;
    a sixth field-effect transistor stage which is connected between said third signal terminal and said reference electric potential;
    a first control line for impressing a first control voltage to the control terminal of said first and third field-effect transistor stages;
    a second control line for impressing the complementary control voltage of said first control voltage to the control terminal of said second and fourth field-effect transistor stages;
    a third control line for impressing a second control voltage to the control terminal of said fifth field-effect transistor stage; and
    a fourth control line for impressing the complementary control voltage of said second control voltage to the control terminal of said sixth field-effect transistor stage.

2. The switch semiconductor integrated circuit according to claim 1, wherein
    between said fifth and sixth field-effect transistor stages and said power source line, the direct current is not coupled respectively by the first and second capacitance.

3. The switch semiconductor integrated circuit according to claim 1, wherein
    high impedance devices are connected between the control terminals of said first and third field-effect transistor stages and said first control line and between the control terminals of said second and fourth field-effect transistor stages and said second-control line, respectively.

4. The switch semiconductor integrated circuit according to claim 1, wherein
    said field-effect transistor stages are series circuits composed of a plurality of field-effect transistors being connected in series one another.

5. The switch semiconductor integrated circuit according to claim 1, wherein each of the field-effect transistors constituting said field-effect transistor stage is multi-gate field-effect transistor.

6. The switch semiconductor integrated circuit according to claim 1, wherein
each of the field-effect transistors constituting said field-effect transistor stage is a JFET.

7. The switch semiconductor integrated circuit according to claim 1, wherein
each of the field-effect transistors constituting said field-effect transistor stage is an MESFET.

8. Communication terminal equipment comprising:
a switch semiconductor integrated circuit having: a first field-effect transistor stage which is connected in series to a first signal path for communicating between a first signal terminal and a second signal terminal; a second field-effect transistor stage which is connected in series to a second signal path for communicating between said second signal terminal and a third signal terminal; a third field-effect transistor stage which is connected in series to a third signal path for communicating between said third signal terminal and a fourth signal terminal; a fourth field-effect transistor stage which is connected in series to a fourth signal path for communicating between said fourth signal terminal and said first signal terminal; a fifth field-effect transistor stage which is connected between said first signal terminal and a reference electric potential; a sixth field-effect transistor stage which is connected between said third signal terminal and said reference electric potential; a first control line for impressing first control voltage to the control terminals of said first and third filed-effect transistor stages; a second control line for impressing the complementary control voltage of said first control voltage to the control terminal of said second and fourth field-effect transistor stages; a third control line for impressing said second control voltage to the control terminal of said fifth field-effect transistor stage; and a fourth control line for impressing the complementary control voltage of said second control voltage to the control terminal of said sixth field-effect transistor stage;

first and second antennas which are electrically connected to said first and third signal terminals;

a receiving part, connected to said second signal terminal, for inputting a high frequency signal received at said first or second antenna; and a transmitting part, connected to said fourth signal terminal, for outputting a high frequency signal to said first or second antenna.

* * * * *